United States Patent
Hess et al.

(10) Patent No.: US 7,572,680 B2
(45) Date of Patent: Aug. 11, 2009

(54) PACKAGED INTEGRATED CIRCUIT WITH ENHANCED THERMAL DISSIPATION

(75) Inventors: Kevin J. Hess, Austin, TX (US); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/033,716

(22) Filed: Feb. 19, 2008

(65) Prior Publication Data

US 2008/0136016 A1 Jun. 12, 2008

Related U.S. Application Data

(62) Division of application No. 11/192,525, filed on Jul. 29, 2005, now Pat. No. 7,355,289.

(51) Int. Cl.
*H01L 21/44* (2006.01)
*H01L 21/48* (2006.01)
*H01L 21/50* (2006.01)

(52) U.S. Cl. ................. 438/124; 438/126; 438/127

(58) Field of Classification Search ............. 438/124, 438/126, 127; 257/706, 707, 713, 787, 796
See application file for complete search history.

(56) References Cited

U.S. PATENT DOCUMENTS

| 6,597,065 B1 | 7/2003 | Efland |
| 6,707,140 B1 | 3/2004 | Nguyen et al. |

FOREIGN PATENT DOCUMENTS

WO 2005010989 A1 2/2005

*Primary Examiner*—Thien F Tran
(74) *Attorney, Agent, or Firm*—James L. Clingan, Jr.; Robert L. King

(57) ABSTRACT

A semiconductor package (10) uses a plurality of thermal conductors (56-64) that extend upward within an encapsulant (16) from one or more thermal bond pads (22, 24, 26) on a die (14) to disperse heat. The thermal conductors may be bond wires or conductive stud bumps and do not extend beyond a lateral edge of the die. One or more of the thermal conductors may be looped within the encapsulant and exposed at an upper surface of the encapsulant. In one form a heat spreader (68) is placed overlying the encapsulant for further heat removal. In another form the heat spreader functions as a power or ground terminal directly to points interior to the die via the thermal conductors. Active bond pads may be placed exclusively along the die's periphery or also included within the interior of the die.

20 Claims, 3 Drawing Sheets

US 7,572,680 B2

PACKAGED INTEGRATED CIRCUIT WITH ENHANCED THERMAL DISSIPATION

FIELD OF THE INVENTION

The present invention relates generally to the packaging of integrated circuits, and more particularly to packages which enhance the ability to dissipate heat.

RELATED ART

As integrated circuits continue to become more and more dense with an ever increasing number of transistors per unit area, there are more transistors switching causing more heat to be generated. Thus the various package types are under continuous pressure to dissipate more heat. One of the measures that is commonly used to gauge the effectiveness of a particular package is called the junction-to-case thermal resistance (theta-JC). The theta-JC, commonly stated in degrees Celsius per watt, represents the heat dissipation capability of the package. Packages are chosen based on several factors such as heat dissipation, electrical performance, size, and cost. Heat dissipation is generally a requirement that must be met whereas the others are tradeoffs. In effect, a given integrated circuit die has a power dissipation requirement and the other issues of electrical performance, size, and cost must be considered in light of that power dissipation requirement. Thus, an improvement in power dissipation can result in one or more of improved performance, reduced size, and reduced cost. The more desirable packages from a cost standpoint are generally plastic. Various plastic packages have been developed with differing electrical characteristics. In plastic packages, generally there is a plastic molding process that results in the integrated circuit being encapsulated by the plastic. Since plastic is generally a thermal insulator, this makes it difficult to dissipate the heat generated by the integrated circuit inside the package. Thus, any improvement in plastic package heat dissipation can result in reduced cost and/or improved performance.

Thus, there is a need for packages that reduce heat for integrated circuits, particularly plastic packages.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect a packaged integrated circuit has bond wires extending vertically upward from the surface of the integrated circuit to the surface of the package, which is preferably plastic. These vertical bond wires are exposed to the ambient so are effective in dissipating heat. The bond wires can be connected to a portion of the surface of the integrated circuit that has no function. In such case the vertical bond wires would be electrically floating. To further enhance the heat dissipation, a thermally conductive metal plate can be connected to the exposed ends of the vertical bond wires. This plate can also function as a power supply plate in which case the vertical bond wires would be connected to the particular power supply terminal such as VDD or ground. This is better understood by reference to the figures and the following description.

Figure 1:
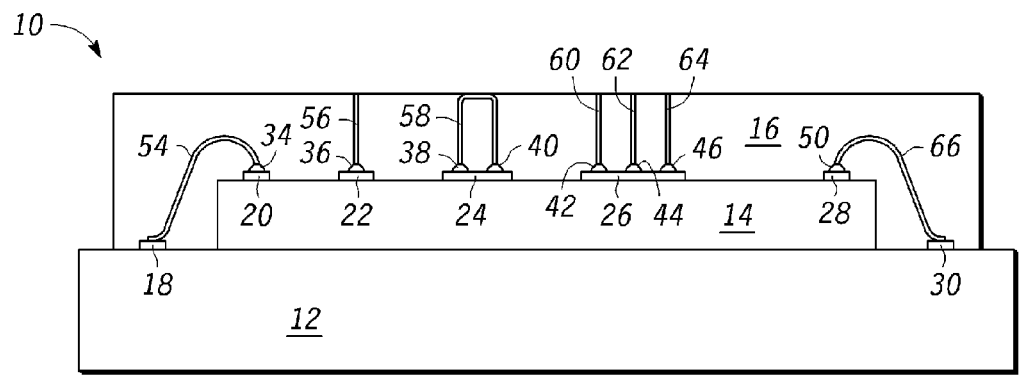
FIG. 1 is a cross section of a packaged integrated circuit according to an embodiment of the invention.

Shown in FIG. 1 is a packaged integrated circuit 10 comprising a package substrate 12, an integrated circuit 14 on package substrate 12, and a plastic encapsulant 16 that is molded to cover the top and side portions of integrated circuit 14 and a portion of the top surface of package substrate 12. There is a small peripheral portion of substrate 12 that is not covered by plastic encapsulant 16. Integrated circuit 14 would typically be a rectangular shaped semiconductor that has been processed to have transistors and possibly other circuit elements configured to perform electrical functions. An integrated circuit is also commonly called a die or chip. On substrate 12 are package bond pads 18 and 30. On the peripheral portion of integrated circuit 14 are active bond pads 20 and 28 which in turn have ball bonds 34 and 50 on them, respectively. An active bond wire 54 is connected to package bond pad 18 by a stitch bond on one end and is held to active bond pad 20 by ball bond 34 on the other end. Similarly, an active bond wire 66 is connected to package bond pad 30 by a stitch bond on one end and is held to active bond pad 28 by ball bond 50 on the other end. The wire bonding of bond wires 54 and 66 is by conventional means.

Packaged integrated circuit 10 further comprises additional ball bonds, bond wires, and bond pads. A thermal bond pad 22 is on integrated circuit 14. A thermal bond wire 56 is connected to thermal bond pad 22 by ball bond 36. Thermal bond wire 56 extends vertically from the surface of integrated circuit 14 to the top surface of plastic encapsulant 16. A thermal bond pad 24, which is on integrated circuit 14, has a ball bond 38 and a stud bump 40 on it. A thermal bond wire 58 extends vertically from ball bond 38 to the surface of plastic encapsulant 16, is bent to have a portion along the surface of plastic encapsulant 16, and is bent downward to be stitch bonded to stud bump 40. The result is a loop of wire that has both ends connected to thermal bond pad 24 and a middle portion exposed at the surface of plastic encapsulant 16. As an alternative, ball bond 38 and stud bump 40 could be placed on two separate thermal bond pads instead of just the one thermal bond pad 24. A thermal bond pad 26, which is on integrated circuit 14, has a ball bond 42, a ball bond 44, and a ball bond 46 on it. A thermal bond wire 60, a thermal bond wire 62, and a thermal bond wire 64 are connected to thermal bond pad 26 by ball bonds 42, 44, and 46, respectively. Thermal bond wires 60, 62, and 64 also extend vertically from thermal bond pad 26 to the surface of plastic encapsulant 16 where they are exposed. A benefit of these thermal bond wires is that they can be placed as shown in FIG. 1 by conventional wirebonding equipment. A benefit of these thermal bond wires is that they can be placed on the surface of integrated circuit 14 as needed to remove heat from portions of the integrated circuit that require higher heat dissipation.

Ball bond 36 is attached to thermal bond pad 22. Thermal bond wire 56 is formed and cut to the desired height prior to the formation of the plastic encapsulant 16. Ball bond 42 is attached to thermal bond pad 26. Thermal bond wire 60 is formed and cut to the desired height prior to the formation of the plastic encapsulant 16. Ball bond 44 is attached to thermal bond pad 26. Thermal bond wire 62 is formed and cut to the desired height prior to the formation of the plastic encapsulant 16. Ball bond 46 is attached to thermal bond pad 26. Thermal bond wire 64 is formed and cut to the desired height prior to the formation of the plastic encapsulant 16.

Stud bump 40 is formed on thermal bond pad 24. Ball bond 38 is formed on thermal bond pad 24. Thermal bond wire 58 is bent to shape and terminated with a stitch bond at stud bump 40. Integrated circuit 14 mounted to substrate 12 is then inserted into a mold where plastic is flowed to form plastic encapsulant 16. The height of thermal bond wires 56, 60, 62, and 64 can be precisely cut using conventional wirebond equipment to the height of the mold. Similarly, the loop in thermal bond wire 58 can be precisely shaped by conventional wirebonding equipment. There may be some wire sweep due to the inflow of the plastic into the mold that causes some movement in the thermal bond wires 56, 58, 60, 62, and 64. The length of the thermal bond wires 56, 58, 60, 62, and 64 can be lengthened so as to compensate for such sweep or any other variation to ensure that they are exposed after the encapsulant is formed.

With thermal bond wires 56, 58, 60, 62, and 64 having an exposed end, there is substantial heat conduction from integrated circuit die 14 to the surface of plastic encapsulant 16. Because thermal bond wires 56, 58, 60, 62, and 64 are highly thermally conductive, especially as compared to a plastic material such as encapsulant 16, heat can be removed by conduction into the ambient. Thus, there is a significant improvement in the theta-JC with the presence of thermal bond wires 56, 58, 60, 62, and 64. Thermal bond wires 56, 58, 60, 62, and 64 are not connected to active circuitry so they are electrically floating. In such case, even if they contact each other due to sweep or other reason, there is no harm to electrical signal processing. That thermal wires 56, 58, 60, 62, and 64 can be effective without being connected to any active circuitry is a significant benefit. Sweep can be a particular problem when extending bond wires to an area inside the periphery of the integrated circuit.

In a typical plastic encapsulation process, there is a thin layer of resin on the surface. If thermal bond wires 56, 58, 60, 62, and 64 have their surfaces that are intended to be exposed covered by resin, much of the beneficial heat dissipation effect is still maintained. Thus a mere resin coating is still considered to be exposed. The additional cost of the vertical bond wires is very low, even if there are several hundred of them. The thermal bond wires are quite small and short. The height of plastic encapsulation 16 above integrated circuit 14 is only about 0.8 millimeter and the diameter of a thermal bond wire is, for example, only about 0.02 millimeter. Thus, although the bond wires are typically gold, the amount used, even for hundreds of them, is quite small. Although, the bond wires for carrying signals and power are desirably of small diameter due to pin out constraints, the thermal bond wires can be thicker to improve heat dissipation. A disadvantage of using different diameter wire is the need to either change the bond wire in the wirebonder or move to a different wirebonder.

Figure 2:
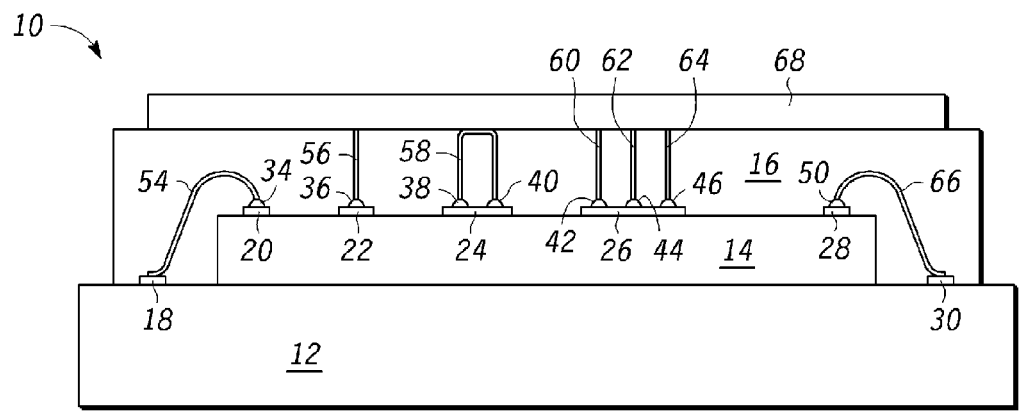
FIG. 2 is a cross section of the packaged integrated circuit of FIG. 1 with an additional feature.

Shown in FIG. 2 is packaged integrated circuit 10 with a heat spreader 68 on the top surface of plastic encapsulant 16. Heat spreader 68 is in contact with the exposed portions of thermal bond wires 56, 58, 60, 62, and 64 to enhance heat dissipation. If a thin layer of encapsulant resin is formed on the vertical end of thermal wires 56, 58, 60, 62, and 64, it can be removed, preferably by polishing the top surface of plastic encapsulant 16, but it could be by another method such as a chemical clean. It may not be necessary to remove also because heat spreader 68 will be to adhere with good thermal conduction even in the presence of the resin. The degree of improvement in removing the resin may not be worth the cost of removing it.

Figure 3:
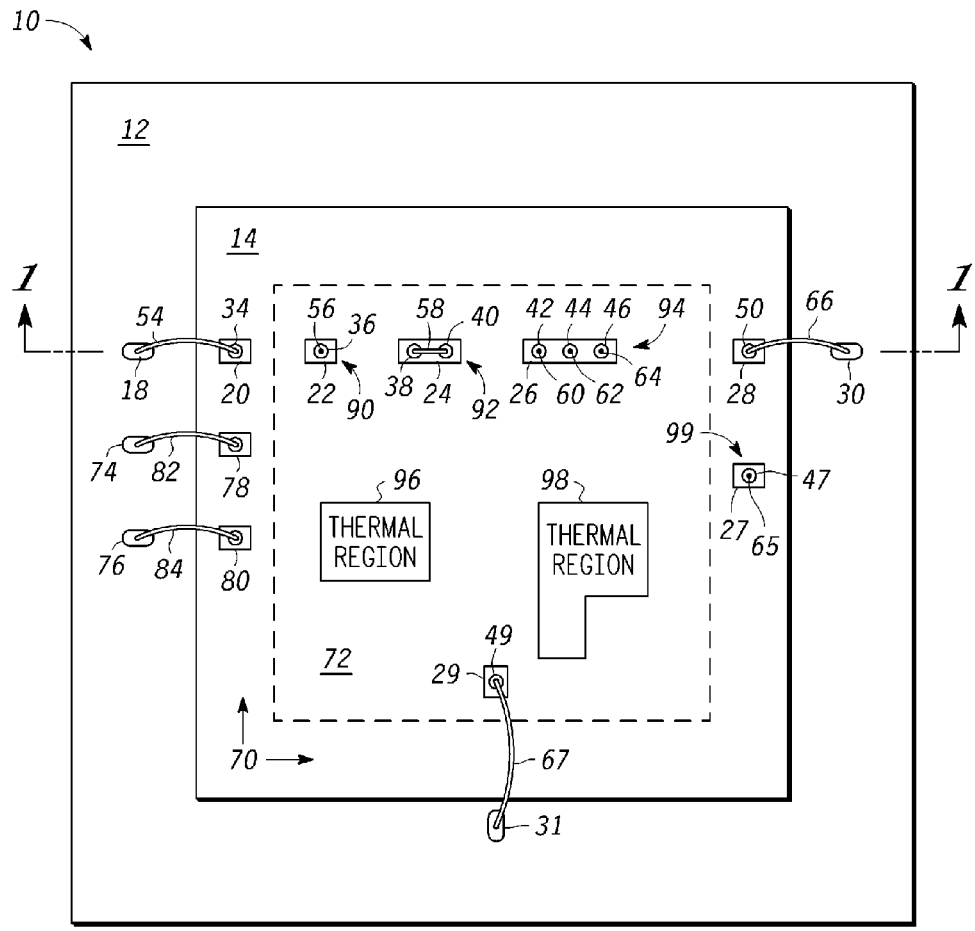
FIG. 3 is a top view of the packaged integrated circuit of FIG. 1.

Shown in FIG. 3 is packaged integrated circuit 10 in a top view. In addition to the features shown in FIG. 1, packaged integrated circuit 10 further comprises a thermal region 96, a thermal region 98, and a thermal region 99 as well as additional active bond wires 82, 84 and 67 and associated active bond pads 78, 80, and 49 and package bond pads 74, 76, and 31. FIG. 3 also shows that thermal bond pad 22, thermal bond wire 56, and ball bond 36 comprise a thermal region 90. Similarly, a thermal region 92 comprises thermal bond pad 24, ball bond 38 and a ball bond with a reverse stitch 40, and thermal bond wire 58. A thermal region 94 comprises thermal bond pad 26, ball bonds 42, 44, and 46, and thermal bond wires 60, 62, and 64. Thermal region 99 comprises a thermal bond pad 27, a ball bond 47, and a bond wire 65. Thermal region 99 depicts that a thermal region can exist in a peripheral area 70 instead of necessarily being in a die circuitry region 72. Thermal regions 96 and 98 are not shown in detail but can be constructed in the same manner as one of thermal regions 90, 92, 94, and 99. The whole integrated circuit need not have a thermal region but thermal regions can simply be placed in locations as needed. This can save time and material to place thermal regions in only those locations that need the extra heat dissipation. Wire bond 67, which extends into die circuitry region 72, is preferably an insulated wire to avoid touching other wires. Packaged integrated circuit 10 is simplified for ease of understanding and it is understood that many more bond wires would be connected than those shown.

Figure 4:
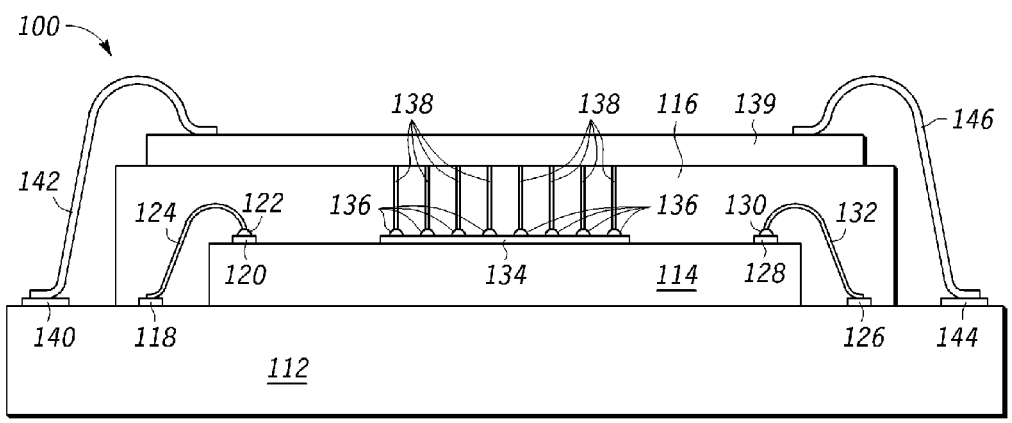
FIG. 4 is a cross section of a packaged integrated circuit according to an alternate embodiment.

Shown in FIG. 4 is a packaged integrated circuit 100 comprising a package substrate 112, an integrated circuit 114 on package substrate 112, a plastic encapsulant 116 over integrated circuit 114 and a portion of substrate 114 adjacent to integrated circuit 204, and a heat spreader 139 on plastic encapsulant 116. An active bond wire 124 is connected to an active bond pad 120 by a ball bond 122 and to a package bond pad 118 by a stitch bond. An active bond wire 132 is connected to an active bond pad 128 by a ball bond 130 and to a package bond pad 126 by a stitch bond. A thermal region comprises a thermal bond pad 134 on integrated circuit 114, a plurality of ball bonds 136 on thermal bond pad 134, and a plurality of thermal bond wires 138. A power wire 142 is connected between heat spreader 139 and a package bond pad 140, which is on package substrate 112, by stitch bonds. Similarly, a power wire 146 is connected between heat spreader 139 and a package bond pad 144, which is on package substrate 112, by stitch bonds. Heat sink 139 in this case is useful not only as a heat spreader but also for power, which can be ground connection or a connection to VDD. For example, heat spreader 139 can operate as a ground shield. In any case, the whole center portion of integrated circuit 114 can be covered by a thermal region because there will be power in all locations and these can be brought to the surface of integrated circuit 114. Power lines 142 and 146 will be placed after heat spreader 139 has been placed and can use a much larger diameter wire for connection than the bond wires that are encapsulated.

Figure 5:
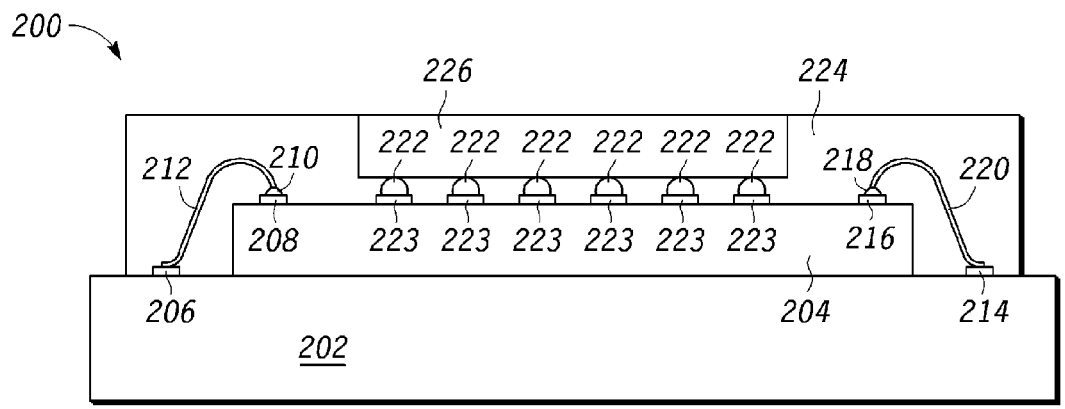
FIG. 5 is a cross section of a packaged integrated circuit according to another alternate embodiment.

Shown in FIG. 5 is a packaged integrated circuit 200 comprising a package substrate 202, a semiconductor die 204, a heat spreader 226, and a plastic encapsulant 224 as well as bond pads, bond wires, ball bonds, and stud bumps. A package bond wire 212 is connected between active bond pad 208 on integrated circuit 204 by ball bond 210 and package bond pad 206, which is on package substrate 202. Similarly, a package bond wire 220 is connected between active bond pad 216 on integrated circuit 204 by ball bond 216 and package bond pad 214, which is on package substrate 202. A plurality of thermal bond pads 223 are on integrated circuit 204. A plurality of stud bumps 222 are on thermal bond pads 223. Heat spreader 226 is on plurality of stud bumps 222. Stud bumps 222 are made as conventional stud bumps. Heat spreader 226 is placed on plurality of stud bumps 222 after wirebonding and before formation of plastic encapsulation 224.

Thus, it is seen that a convenient way to reduce theta-JC is achieved by bringing wires or stud bumps vertically upward. They are either exposed or connected to a heat spreader. They need not extend outside the periphery of the integrated circuit and so can be kept short to avoid problems with sweep. The vertically oriented thermal conductors provide a more efficient, shorter thermal conduction path from the surface of the integrated circuit to the exterior of the encapsulated package than does lateral orientations of thermal conductors or wires.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of packaging an integrated circuit comprising:
   providing a semiconductor die comprising a plurality of active bond pads having an electrical function associated therewith and comprising a plurality of thermal bond pads;
   locating the plurality of thermal bond pads within an inner region of the semiconductor die;
   placing the semiconductor die overlying a substrate;
   connecting one or more thermal conductors to each of the plurality of thermal bond pads, each of the one or more thermal conductors extending upward from the semiconductor die, each of the one or more thermal conductors not extending beyond a peripheral edge of the semiconductor die; and
   surrounding the semiconductor die, the plurality of thermal bond pads, the plurality of active bond pads and the one or more thermal conductors with an encapsulant to permit the thermal conductors to conduct heat from the semiconductor die to an upper surface of the encapsulant.

2. The method of claim 1 further comprising:
   providing at least one conductive heat spreader overlying the one or more thermal conductors for conducting heat from the one or more thermal conductors.

3. The method of claim 2 further comprising:
   coupling the conductive heat spreader to at least one of the one or more thermal conductors for use as a signal conductor for either conducting a power supply voltage or providing a ground reference potential to the semiconductor die via the at least one of the one or more thermal conductors.

4. The method of claim 1 further comprising:
   locating at least one of the plurality of active bond pads within a central region of the semiconductor die and locating a remainder of the plurality of active bond pads within a peripheral region of the semiconductor die.

5. The method of claim 1 further comprising:
   providing at least one of the one or more thermal conductors as a thermal bond wire that forms a loop within the encapsulant and contacts one or more of the plurality of thermal bond pads, the loop reaching an upper surface of the encapsulant.

6. A method of making a packaged integrated circuit comprising:
   providing a semiconductor die overlying a substrate, wherein the semiconductor die has active circuitry;
   forming a plurality of thermal bond pads over the active circuitry;
   forming a plurality of thermal bond wires that are connected to the thermal bond pads and extend upward from the semiconductor die and terminating without extending beyond a perimeter of the semiconductor die; and
   surrounding the semiconductor die and the plurality of thermal bond wires with an encapsulant.

7. The method of claim 6 wherein the step of surrounding is further characterized by one or more of the plurality of thermal bond wires extending to an upper surface of the encapsulant.

8. The method of claim 6 wherein the step of forming a plurality of thermal bond wires is further characterized by at least one of the plurality of thermal bond wires being connected to two thermal bond pads by extending from a first of the two thermal bond pads away from a surface of the semiconductor die and returning toward the surface of the semiconductor die to connect to a second of the two thermal bond pads.

9. The method of claim 6 further comprising:
   forming a conductive heat spreader overlying at least one of the plurality of thermal bond wires for conducting heat from the at least one of the plurality of thermal bond wires and radiating the heat from the packaged integrated circuit.

10. The method of claim 9 wherein the step of forming the conductive heat spreader is further characterized by at least one of the plurality of thermal bond wires being connected to the at least one conductive heat spreader to function as a power conductor or a ground conductor overlying the semiconductor die.

11. The method of claim 6 wherein the step of forming the plurality of thermal bond pads is further characterized by a portion of the plurality of thermal bond pads not being connected to any active circuitry within the semiconductor die.

12. The method of claim 11 wherein the portion is substantially all of the plurality of thermal bond pads.

13. The method of claim 6 wherein the step of forming the plurality of thermal bond pads is further characterized by at least one of the plurality of thermal bond pads being connected to a power or a ground terminal within the active circuitry.

14. The method of claim 6 further comprising:
   forming a plurality of active bond pads positioned around a periphery of the semiconductor die within a pad ring region and electrically connected to respective package bond pads outside the perimeter of the semiconductor die.

15. A method of making a packaged integrated circuit comprising:
   providing a semiconductor die overlying a substrate;
   forming an active bond pad having an electrical function associated therewith and a first thermal bond pad not having an electrical function associated therewith overlying the semiconductor die;

forming an active conductor and a thermal conductor connected to the active bond pad and the first thermal bond pad, respectively, and extending upward from the semiconductor die; and surrounding the semiconductor die, the active bond pad, the first thermal bond pad, the active conductor, and the thermal conductor with an encapsulant, whereby the thermal conductor conducts heat from the semiconductor die to an upper surface of the encapsulant.

16. The method of claim 15 wherein the step of forming the active conductor and a thermal conductor is further characterized by the thermal conductor comprising one of a group consisting a conductive stud bump and a bond wire.

17. The method of claim 15 wherein the step of forming the active bond pad and the first thermal bond pad further comprises forming a second thermal bond pad overlying the semiconductor die and wherein the step of forming the active conductor and a thermal conductor is further characterized by the thermal conductor extending from the first thermal bond pad away from the semiconductor die and returning toward the semiconductor die to connect to the second thermal bond pad.

18. The method of claim 15 further comprising:

forming a conductive heat spreader on the upper surface of the encapsulant and contacting the thermal conductor for conducting heat from the thermal conductor.

19. The method of claim 18 wherein the step of forming the conductive heat spreader is further characterized by the conductive heat spreader being a signal conductor for conducting either a power supply voltage or a ground reference potential.

20. The method of claim 15 wherein the step of forming the active bond pad and the first thermal bond pad is further characterized by the of active bond pad being located within a peripheral region of the packaged integrated circuit and the first thermal bond pad is located within a central region of the packaged integrated circuit.

\* \* \* \* \*